US010401159B2

(12) United States Patent
Zell et al.

(10) Patent No.: US 10,401,159 B2
(45) Date of Patent: *Sep. 3, 2019

(54) APPARATUS FOR DETECTING A PRE-ALIGNING ELEMENT AT A WAFER

(71) Applicant: Infineon Technologies AG, Neubiberg (DE)

(72) Inventors: Thomas Zell, Villach (AT); Horst Kittner, Klagenfurt (AT)

(73) Assignee: Infineon Technologies AG, Neubiberg (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/272,285

(22) Filed: Sep. 21, 2016

(65) Prior Publication Data

US 2017/0010092 A1    Jan. 12, 2017

Related U.S. Application Data

(63) Continuation of application No. 13/936,050, filed on Jul. 5, 2013, now Pat. No. 9,476,701.

(51) Int. Cl.
*G01B 11/27* (2006.01)
*H01L 21/68* (2006.01)
*H01L 23/544* (2006.01)

(52) U.S. Cl.
CPC .......... *G01B 11/272* (2013.01); *G01B 11/27* (2013.01); *H01L 21/681* (2013.01); *H01L 23/544* (2013.01); *H01L 2223/54426* (2013.01)

(58) Field of Classification Search
CPC ......... H01L 2223/54426; H01L 23/544; H01L 21/681; G01B 11/272
See application file for complete search history.

(56) References Cited

U.S. PATENT DOCUMENTS

| | | | |
|---|---|---|---|
| 4,233,625 A | 11/1980 | Altman | |
| 5,513,948 A * | 5/1996 | Bacchi | B65G 47/24 198/394 |
| 5,648,854 A | 7/1997 | McCoy et al. | |
| 5,876,819 A | 3/1999 | Kimura et al. | |
| 6,038,029 A * | 3/2000 | Finarov | G01B 11/00 356/399 |
| 6,777,820 B2 | 8/2004 | Chiba et al. | |
| 7,723,710 B2 | 5/2010 | Campidell et al. | |
| 9,476,701 B2 * | 10/2016 | Zell | G01B 11/27 |

(Continued)

*Primary Examiner* — Dominic J Bologna
(74) *Attorney, Agent, or Firm* — Slater Matsil, LLP

(57) ABSTRACT

An apparatus for detecting a pre-aligning element at a wafer and a method for pre-aligning a wafer are disclosed. In an embodiment, the apparatus includes a sensor arrangement configured to illuminate subsequent edge portions of the wafer edge and to output a first and a second sensor signal, wherein the first sensor signal is based on the transmitted fractions of the illumination and the second sensor signal is based on the reflected fractions of the illumination; and an evaluation unit configured to evaluate the first sensor signal and to determine a first position information indicating a coarse position of the pre-aligning element, and, after having determined the first position information, to determine a second position information based on the second sensor signal and the first position information, wherein the second position information indicates a fine position of the pre-aligning element.

19 Claims, 5 Drawing Sheets

(56) References Cited

U.S. PATENT DOCUMENTS

| | | | |
|---|---|---|---|
| 2009/0075248 A1* | 3/2009 | Debreczeny | G01N 15/06 435/3 |
| 2009/0189054 A1* | 7/2009 | Campidell | H01L 21/67282 250/206 |
| 2013/0139950 A1 | 6/2013 | Kannaka et al. | |
| 2013/0280922 A1 | 10/2013 | Lin et al. | |

* cited by examiner

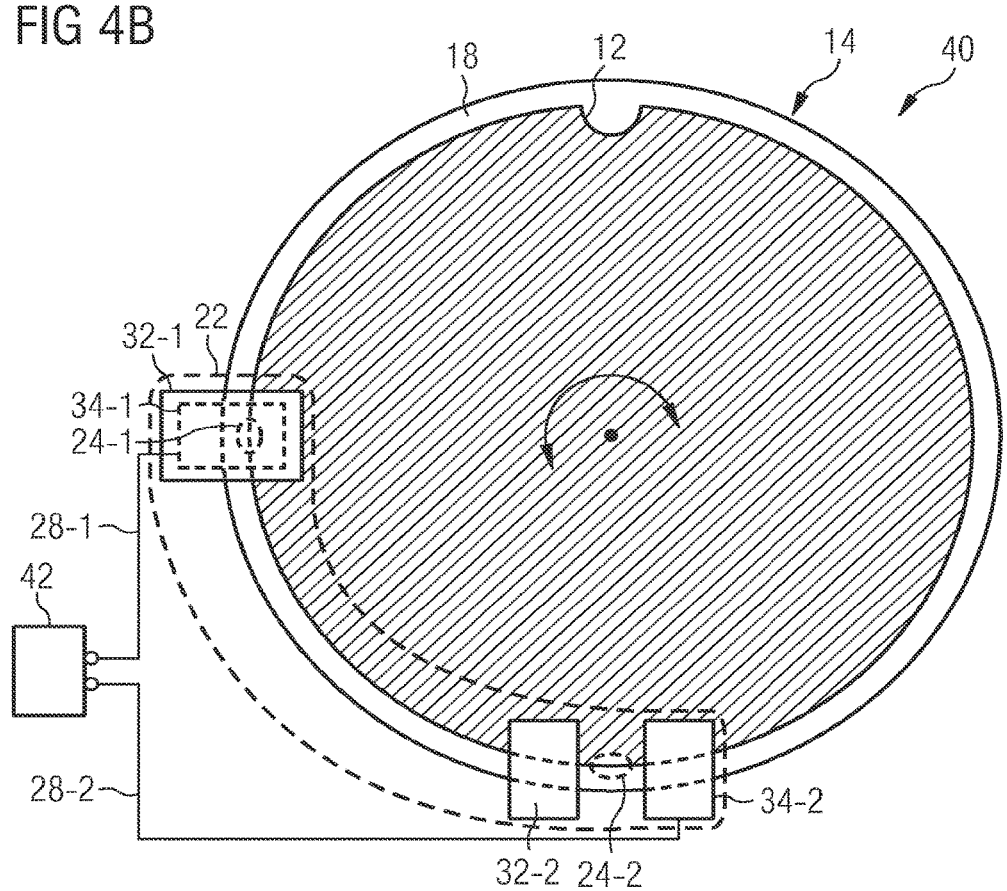

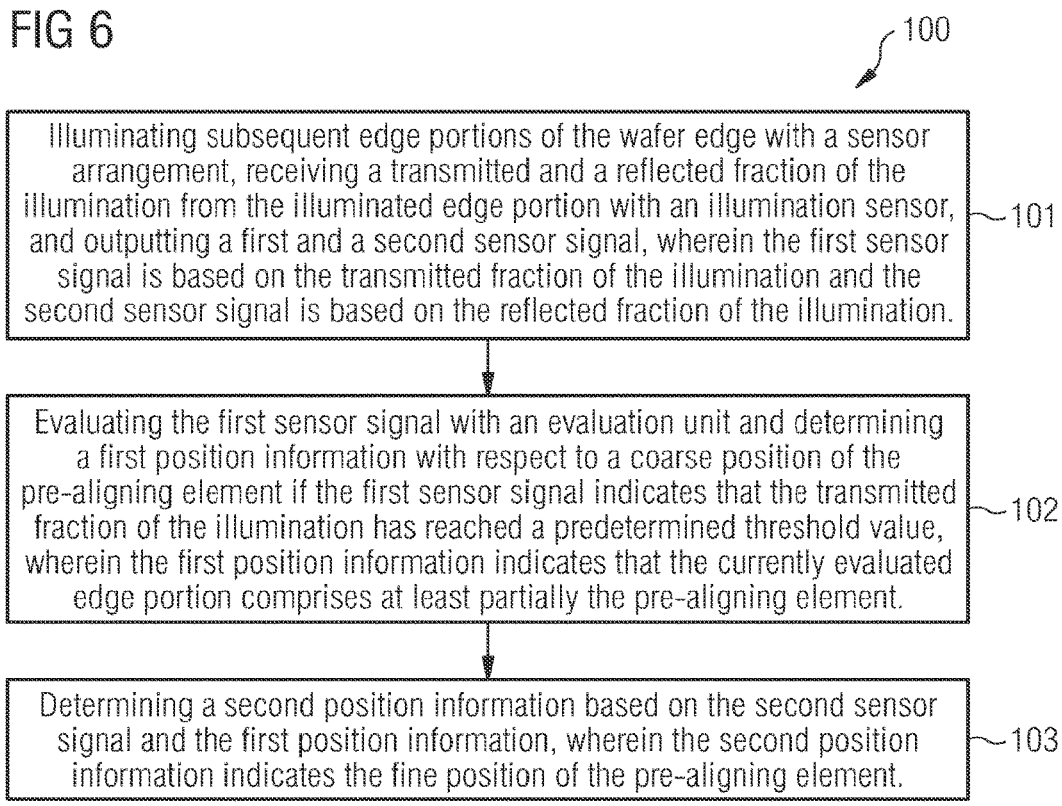
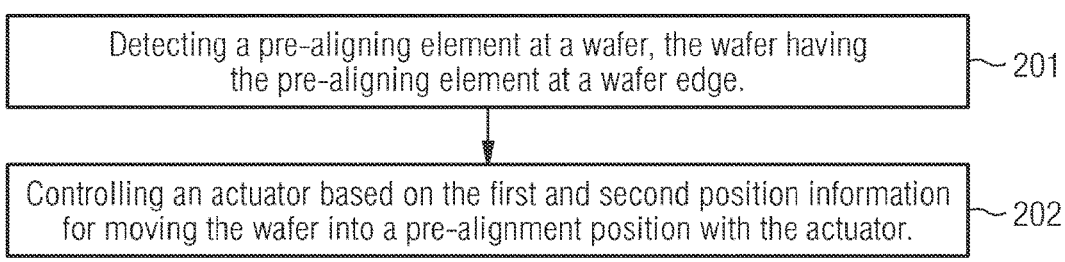

APPARATUS FOR DETECTING A PRE-ALIGNING ELEMENT AT A WAFER

CROSS-REFERENCE TO RELATED APPLICATIONS

This application is a continuation of U.S. patent application Ser. No. 13/936,050, filed Jul. 5, 2013, and entitled "Apparatus for Detecting a Pre-Aligning Element at a Wafer," which application is incorporated herein by reference.

TECHNICAL FIELD

The invention relates to apparatus and methods for aligning semiconductor substrates or wafers carried by a support.

Embodiments relate to an apparatus for detecting a pre-aligning element at a wafer. Further embodiments relate to a pre-aligning system for aligning a wafer. Further embodiments relate to a method for detecting a pre-aligning element at a wafer. Other embodiments relate to a method for pre-aligning a wafer.

BACKGROUND

Wafers are structures comprising semiconductor material, e.g. silicon. The semiconductor material comprises a crystallographic orientation, which is indicated by pre-aligning elements at the wafer, e.g. notches or flats. For a processing of a wafer the crystallographic orientation of the semiconductor material and therefore the orientation of the pre-aligning element has to be detected.

SUMMARY OF THE INVENTION

Embodiments provide an apparatus for detecting a pre-aligning element at a wafer, the wafer having the pre-aligning element at a wafer edge. The apparatus comprises a sensor arrangement and an evaluation unit. The sensor arrangement is configured to illuminate subsequent edge portions of the wafer edge, to receive transmitted fractions and reflected fractions of the illumination from the illuminated edge portions with an illumination sensor and to output a first and a second sensor signal, wherein the first sensor signal is based on the transmitted fractions of the illumination and the second sensor signal is based on the reflected fractions of the illumination. The evaluation unit is configured to evaluate the first sensor signal and to determine a first position information with respect to a coarse position of the pre-aligning element if the first sensor signal indicates that the transmitted fractions of the illumination have reached a predetermined threshold value, wherein the first position information indicates that the pre-aligning element is at least partially located within the currently evaluated edge portion, and after having determined the first position information to determine a second position information based on the second sensor signal and the first position information, wherein the second position information indicates the fine position of the pre-aligning element.

Further embodiments provide a method for detecting a pre-aligning element at a wafer, wherein the wafer has the pre-aligning element at a wafer edge. Subsequent edge portions of the wafer edge are illuminated with a sensor arrangement and transmitted fractions and reflected fractions of the illumination are received from the illuminated edge portion with an illumination sensor. A first and a second sensor signal are outputted, wherein the first sensor signal is based on the transmitted fractions of the illumination and the second sensor signal is based on the reflected fractions of the illumination. The first sensor signal is evaluated with an evaluation unit and a first position information is determined with respect to a coarse position of the pre-aligning element if the first sensor signal indicates that the transmitted fractions of the illumination have reached a predetermined threshold value. The first position information indicates that pre-aligning element is at least partially located within the currently evaluated edge portion. After having determined the first position information, a second position information is determined based on the second sensor signal and the first position information, wherein the second position information indicates the fine position of the pre-aligning element.

BRIEF DESCRIPTION OF THE DRAWINGS

Embodiments of the present invention are described herein making reference to the appended drawings.

FIG. 4b shows a schematic top view of the apparatus of FIG. 4a;

FIG. 6 shows a flowchart of a method for detecting a pre-aligning element at a wafer shown in FIG. 4a;

FIG. 7 shows a flowchart of another method for detecting a pre-aligning element at a wafer shown in FIG. 4a.

DETAILED DESCRIPTION OF THE INVENTION

Figure 1:
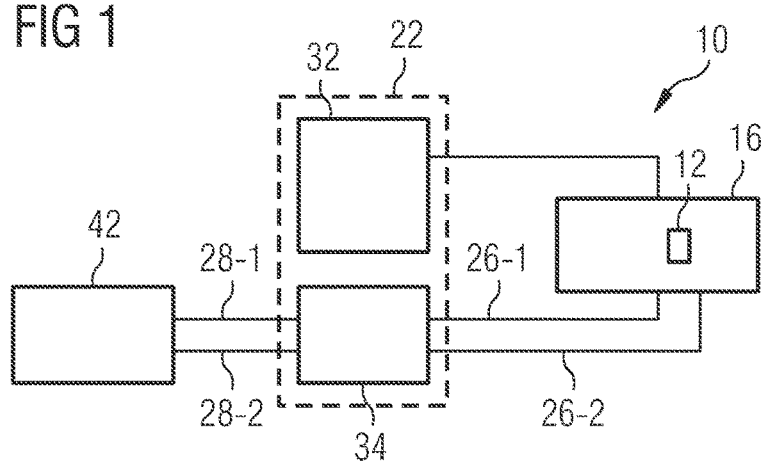
FIG. 1 shows a schematic block diagram of an apparatus for detecting a pre-aligning element at a wafer according to an embodiment.

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to those skilled in the art that embodiments of the present invention may be practiced without these specific details. In other instances, well known structures and devices are shown in block diagram form rather than in detail in order to avoid obscuring embodiments of the present invention. In addition, features of the different embodiments described hereinafter may be combined with each other, unless specifically noted otherwise.

FIG. 1 shows a block diagram of an apparatus 10 for detecting a pre-aligning element 12 at a wafer edge of a wafer 16, the apparatus 10 comprising a sensor arrangement 22 and an evaluation unit 42. The pre-aligning element 12 is configured to indicate an orientation of the wafer 16. The wafer 16 may have flats or crystallographic orientation notches at one or more sides as a pre-aligning element indicating a crystallographic orientation of the wafer 16.

The sensor arrangement 22 is configured to illuminate subsequent edge portions of the wafer edge, to receive transmitted fractions 26-1 and reflected fractions 26-2 of the illumination from the illuminated edge portions with an illumination sensor 34, and to output a first and a second sensor signal 28-1 and 28-2, wherein the first sensor signal 28-1 is based on the transmitted fractions 26-1 of the illumination and the second sensor signal is based on the reflected fractions 26-2 of the illumination.

The evaluation unit 42 is configured to evaluate the first sensor signal 28-1 and to determine a first position information with respect to a coarse position of the pre-aligning element if the first sensor signal 28-1 indicates that the transmitted fractions 26-1 of the illumination have reached a predetermined threshold value, wherein the first position information indicates that pre-aligning element 12 is at least partially located within the currently evaluated edge portion. The evaluation unit 42 is further configured to determine a second position information based on the second sensor signal 28-2 and the first position information after having determined the first position information, wherein the second position information indicates the fine (precise) position of the pre-aligning element with respect to a reference position. The reference position may be an intersection of coordinate axes or any other defined point of the coordinate system. The reference position may be associated to a current orientation of the stepper motor. The coordinate system may comprise any type of coordinates, e.g. Cartesian or polar. Different types of coordinates may be transformed or converted into each other. A position within this coordinate system may be associated to the second position information. As a result, a coordinate system may be spanned across the wafer, wherein the wafer is located at a known position of the coordinate system with a known orientation. The reference position may be associated for example to a current orientation of a stepper motor, e.g. a current step of the motor within a defined number of steps describing a full rotation of the stepper motor or an angle of a motor shaft of the stepper motor with respect to a defined angle, e.g. zero degrees.

The pre-aligning may be done by a wafer stepper or other apparatus configured to process wafers. Actually, the pre-aligning element, e.g. a notch or a flat, can be searched by the steppers utilizing transmitted illumination and by matching a detected pattern to an expected pattern of the pre-aligning element. The pre-alignment is a positioning of the wafer before loading it on a process chuck. A task herein is, that steppers are unable to reliably detect pre-aligning elements, due to residuals of adhesives which shift the detected pattern of the pre-aligning element and therefore the steppers reject the discs, discard it respectively, which leads to increased costs. The adhesive is used to fix the wafer to a wafer support and residuals of the adhesive located nearby the pre-aligning element cause additional absorption or blocking of transmitted illumination causing errors, as described in exemplary in FIGS. 5a and 5b. To improve the chance of detection, the notch can be cleaned after mounting it to the stepper, wherein a success rate of the method is less than 100%. Some of the rest of the wafers have to be discarded.

A portion of the transmitted fractions 26-1 of the illumination and therefore the first sensor signal 28-1 depends on a portion of illumination emitted by the illumination source 32 towards the illumination sensor 34 which is not blocked, absorbed or reflected by the wafer 16 or the wafer support 14 which may carry the wafer to form a wafer arrangement. The wafer support 14 may comprise an at least partially a transparent material, e.g. glass or a transparent synthetic material (plastic) configured to let pass illumination emitted by the illumination source 32. The wafer edge is arranged with respect to the illumination source 32 and the illumination sensor 34 in a way that the portion of the transmitted fractions 26-1 of the illumination is varying depending on a shape of the wafer edge, i.e. is based on at least a partially presence or an absence of the pre-aligning element within the currently illuminated edge portion. In case the pre-aligning element 12 is located at least partially and therefore present within the currently illuminated edge portion and therefore within a first range of detection, the currently transmitted fraction 26-1 comprises a different, e.g. a higher, portion than if the pre-aligning element 12 is located outside the edge portion. In case of an absence of the pre-aligning element 12 with respect to the first range of detection, the wafer 16 absorbs or blocks a higher share of the illumination which leads to a lower level of the transmitted fractions 26-1 of the illumination.

The first position information based on the transmitted fractions 28-2 of the illumination indicates a coarse position of the pre-aligning element inasmuch as reaching the predetermined threshold value by the first sensor signal 28-1 indicates the position of the pre-aligning element 12 to be positioned within the currently illuminated edge portion, within the first range of detection respectively. The portion of the transmitted fractions 26-1 is dependent on the actual position of the pre-aligning element within the illuminated edge portion as well as from other effects which reduce the transmission of the illumination emitted by the illumination source 32, e.g. adhesive residuals at the wafer 16 or at a wafer support.

Reflected portions of the illumination indicate the position of the pre-aligning element with a high accuracy as a matching of patterns of the detected pre-aligning element with expected patterns of the pre-aligning element can be performed. A matching of a currently evaluated pattern with the expected pattern, e.g. by a mathematical algorithm or a software, therefore enables to evaluate the fine position of the pre-aligning element. Thus, the first position information gives a reliable information about the presence of the pre-aligning element within a certain area, e.g. the illuminated edge portions, and a coarse information about the position of the pre-aligning element within this range, whereas the second position information gives a more accurate information about the exact position of the pre-aligning element. The apparatus is configured to combine both aspects so that the method is unaffected by disturbing effects, e.g. residuals of adhesives or grooves at a wafer surface caused by grinding steps of manufacturing processes, e.g. a so called TAIKO process. For example, to avoid these grooves being detected as a false pre-aligning element by evaluating the reflected fractions of the illumination, a reliable first position information is used to verify the second position information and to obtain an accurate position information. The second sensor signal may be evaluated or gathered during the whole pre-aligning process and, in case the first position information indicates the pre-aligning element being at least partially present within the first range of detection can be evaluated in combination with the first position information. Alternatively, the second sensor signal may be evaluated or gathered only in case the first position information indicates the pre-aligning element being at least partially present within the first range of detection.

In case, the coarse position is fine enough for the currently evaluated wafer and therefore fine enough for the currently evaluated pre-aligning element, for example with respect to process parameters defined by following process steps, the second position information can be used to verify the position information.

As the first position information indicates the coarse position of the pre-aligning element 12 within the first range of detection, the evaluation unit 42 is configured to match this first position information with the second sensor signal 28-2.

In case the second sensor signal 28-2 indicates the position of the pre-aligning element 12 within the currently illuminated edge portion and the first position information indicates the pre-aligning element 12 being at least partially located within the currently illuminated edge portion, the second position information is determined by the evaluation unit 42. The second position information defines the position of the pre-aligning element 12 within a second range of detection. The second range of detection is equal or smaller than the first range of detection. By determining the presence of the pre-aligning element 12 within an equal or smaller range of detection, the position information may be more detailed and/or finer. Therefore, by evaluating the reflected fractions 26-2 of the illumination a determination of the position of the pre-aligning element 12 can be performed with a higher precision.

Theoretically, the first and the second position information may have the same or a comparable precision with respect to the position of the pre-aligning element 12, if no residuals of the adhesive are present in the range of the pre-aligning element 12.

The first sensor signal 28-1 can be a degree of measured intensity or brightness of the transmitted fraction 26-1 of the illumination for example by a photo diode. The second sensor signal 26-2 can be realized as a multi-pixel receiver or resolution sensor which is configured to output a video frame or a picture for example which may be evaluated by a mathematical algorithm for edge detection.

The sensor arrangement 22 does not define or require specific locations for illumination sources 32 or illumination sensors 34. Illuminated edge portions of the wafer edge with respect to an illumination for creating the transmitted fractions 26-1 or the reflected fractions 26-2 can be located adjacent to each other or maybe with an offset distance in between. In case of an offset distance between the illuminated edge portions, two pairs of illumination sources and associated illumination sensors may be used, one pair located at each illuminated edge portion. For obtaining the first position information, the appropriate illumination source 32 and the appropriate illumination sensor 34 are arranged on opposing sides of the wafer 16, so that the pre-aligning element 12 can be located at least partially between the illumination source 32 and the illumination sensor 34. For obtaining the second sensor signal 28-2, the appropriate illumination source 32 and the appropriate illumination sensor 34 are arranged on the same side of the wafer 16 so that a reflection of the illumination is sensed by the illumination sensor 32.

Embodiments of the sensor arrangement 22 are described in the following, wherein, for example, the illumination is generated by two illumination sources 32-1 and 32-2 or the transmitted fractions 26-1 and the reflected fractions 26-2 of the illumination are sensed by two illumination sensors 34-1 and 34-2.

The illumination source 32 may be a light sensor, for example a laser or a light emitting diode (LED), e.g. in an ultraviolet (UV) to infrared (IR) range. For creating the transmitted fraction 26-1 and the reflected fraction 26-2 of the illumination, an illumination source 32-1 and 32-2 may be arranged within the sensor arrangement 22. Alternatively one illumination source 32 may be arranged to illuminate the edge portions of the wafer 16 and to be the source for both, the transmitted fractions 26-1 and the reflected fractions 26-2 of the illumination.

The first sensor signal 28-1 may be provided by a photo diode or a multi-pixel receiver which is configured to receive the transmitted fraction 26-1 of the illumination from the illuminated edge portion. The pixels of the multi-pixel receiver may be arranged in a line-shaped manner or in a multi-line manner. In case of an absence of the pre-aligning element within the currently evaluated edge portion, the multi-pixel receiver may receive the transmitted fraction 26-1 of the illumination and may provide data, e.g. picture data or a video frame, indicating a brightness of the picture of the multi-pixel receiver. Alternatively, the amount of the transmitted fractions 26-1 received by the multi-pixel receiver may be close to zero in case of the absence of the pre-aligning element 12. In case of a presence of the pre-aligning element within the currently evaluated edge portion, the amount of the transmitted fraction 26-1 of the illumination may increase and therefore result in a changed information of the picture of the multi-pixel receiver with respect to the brightness of the picture data as soon as parts of the pre-aligning element 12 start to be located within the range evaluated by the multi-pixel receiver.

The predefined threshold level indicating the pre-aligning element 12 being present at least partially within the currently evaluated edge portion may be defined in an absolute or in a relative manner. In an absolute manner, for example the total brightness of a picture is defined to be increased to more than 10%, 30%, 50% or 70% of a possible maximum in case of the pre-aligning element being located at least partially within the currently evaluated edge portion than in case of an absence of the pre-aligning element. In a relative manner, for example the brightness of the picture is defined to be at least 20%, 50%, 70% or 100% higher in case of the pre-aligning element being located at least partially within the currently evaluated edge portion than in case of an absence of the pre-aligning element.

In general, the predefined threshold level may be defined in any way depending on different parameters, e.g. the sensor type to be utilized, a sensor sensitivity or a layout of the sensor arrangement, for example the number of illumination sources or illumination sensors to be arranged at the sensor arrangement.

The second sensor signal 28-2 may be provided for example by a multi-pixel receiver, which enables the case that both sensor signals 28-1 and 28-2 can be provided by the same device. In case both, the first and the second sensor signal 28-1 and 28-2 are provided by a multi-pixel receiver, the evaluation unit 42 may evaluate the first sensor signal 28-1 for example in terms of brightness and afterwards, after the first position information indicates that the pre-aligning element is at least partially present within the currently evaluated edge portion, switch to evaluate the second sensor signal and to determine the second position information by evaluating the matching of edges instead of an evaluation of brightness. Alternatively, the evaluation unit may be configured to buffer the signal provided by the multi-pixel receiver. When determining the second position information the second sensor signal 28-2 may be used in terms of reading the buffered signal.

Alternatively, in case two illumination sensors 34-1 and 34-2 use different sensing methods, for example a photo diode to receive the transmitted fraction 26-1 and a multi-pixel receiver to receive the reflected fraction 26-2 of the illumination, the illumination sensors 34-1 and 34-2 may be arranged next to each other and/or be located within one housing. Alternatively bot sensors 34-1 and 34-2 may be located with a distance between each other.

Figure 2:
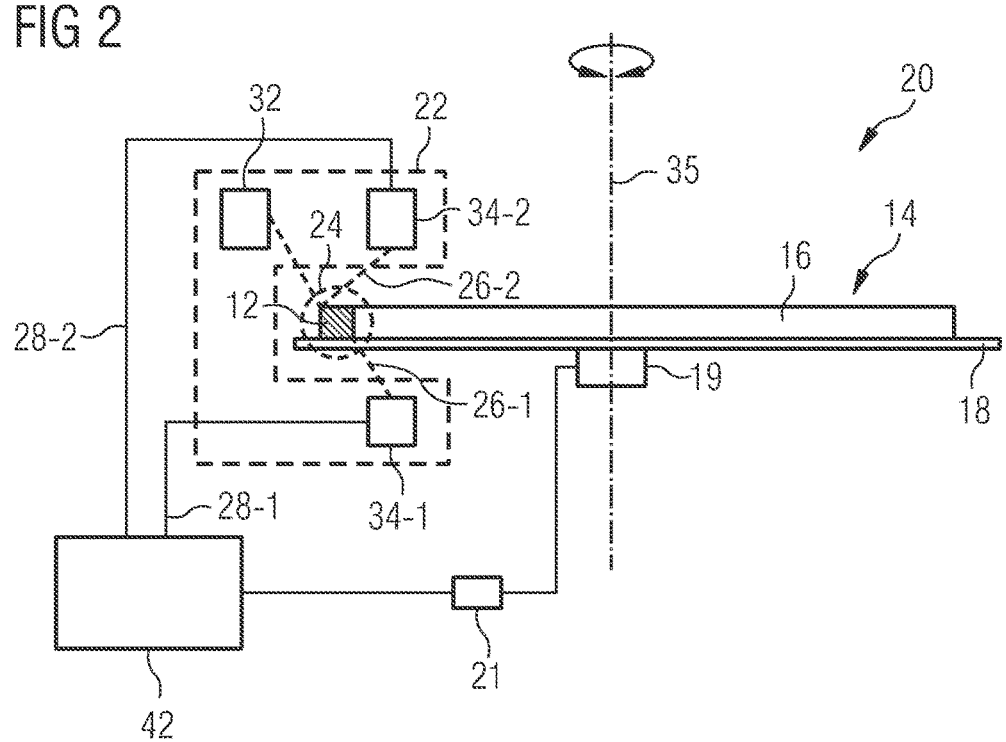
FIG. 2 shows a schematic side view of an apparatus for detecting a pre-aligning element according to another embodiment.

FIG. 2 shows a schematic side view of an apparatus 20 for detecting the pre-aligning element 12 at the wafer edge of the wafer 16. The wafer 16 is fixed to a wafer support 18 for carrying the wafer 16, wherein the wafer support 18 and the wafer 16 form a wafer arrangement 14. The sensor arrangement 22 comprises a first illumination sensor 34-1 configured to sense the transmitted fractions 26-1 of the illumination, a second illumination sensor 34-2 configured to sense the reflected fractions 26-2 of the illumination, and the illumination source 32 configured to illuminate subsequent edge portions 24 of the wafer edge. The illumination source 32 and the second illumination sensor 34-2 are arranged on the same side of the wafer arrangement 18. The first illumination sensor 34-1 is arranged at the opposing side of the wafer arrangement 14. The apparatus 20 further comprises an actuator 19 configured to move the wafer 16 into a pre-alignment position and a control unit 21 configured to control the actuator 19 for pre-aligning the wafer 16 based on the first and second position information. The wafer 16 is rotatable with respect of an axis of rotation 35 forming a center of rotation of the wafer 16 and therefore the pre-aligning element 12 is movable with respect to the sensor arrangement 22. The first or the second position information comprises a rotation information with respect of the pre-aligning element 12 and the center of rotation, the rotation information defining the first position information and/or the second position information in a polar coordinate system or a Cartesian coordinate system.

Such an embodiment as shown in FIG. 2 is able to reduce the required hardware and therefore the required costs as only one illumination source 32 has to be provided and the apparatus 20 requires less space.

The illumination source 32 and the second illumination sensor 34-2 are arranged at the side of the wafer 16 opposing the side of the wafer 16 next to the wafer support 18. In some embodiments, the illumination source 32 and the second illumination sensor 34-2 are arranged at the side of the wafer arrangement 14, which is defined by the side of the wafer support 18 opposing the wafer 16.

Figure 3:
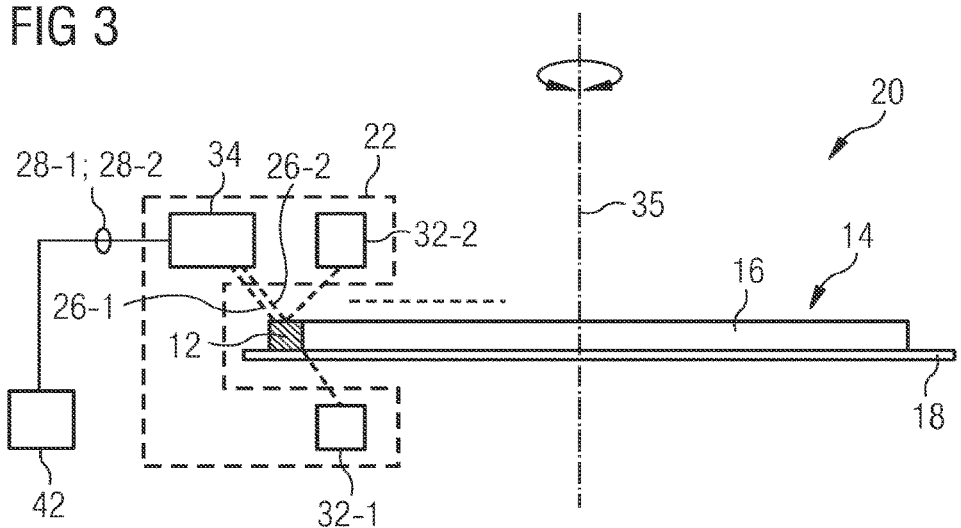
FIG. 3 shows a schematic side view of an apparatus for detecting a pre-aligning element according to another embodiment.

FIG. 3 shows a schematic side view of an apparatus 30 for detecting the pre-aligning element 12 at the edge of the wafer 16. The sensor arrangement 22 comprises an illumination sensor 34 configured to sense the transmitted fractions 26-1 and the reflected fractions 26-2 of the illumination, a first illumination source 32-1 configured to illuminate the wafer edge for creating the transmitted fractions 26-1 of the illumination and a second illumination source 32-2 configured to illuminate the wafer edge for creating the reflected fractions 26-2 of the illumination. The second illumination source 32-2 and the illumination sensor 34 are arranged at the same side of the wafer arrangement 14, wherein the first illumination source 32-1 is arranged at the opposing side of the wafer arrangement 14. The second illumination source 32-2 and the illumination sensor are arranged at the side of the wafer 16 opposing the side of the wafer 16 next to the wafer support 18. In other embodiments the second illumination source 32-2 and the illumination sensor are arranged at the side of the wafer arrangement 14 defined by the side of the wafer support which is averted from the wafer 16.

The illumination sensor 34 can be configured to output the first sensor signal 28-1 and the second sensor signal 28-2 concurrently. Alternatively, the sensor can be configured to be switched from outputting the first sensor signal to outputting the second sensor signal.

In alternative embodiments, two illumination sources and two illumination sensors are arranged at the wafer to illuminate subsequent edge portions. The subsequent edge portions may be located with a distance between them.

Figure 4A:
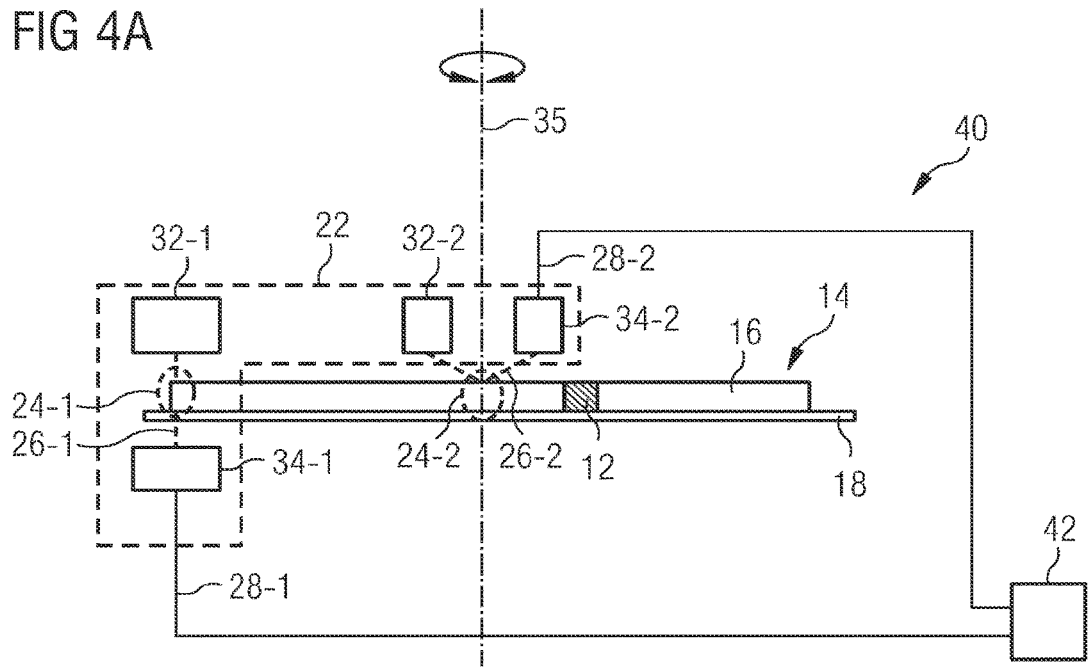
FIG. 4a shows a schematic side view of an apparatus for detecting a pre-aligning element according to an embodiment.

FIG. 4a shows a cross-sectional view of an apparatus 40 for detecting a pre-aligning element 12, e.g. a notch or a flat at the wafer 16 which is carried by a wafer support 18. The wafer 16 comprises the pre-aligning element 12 at a wafer edge. The sensor arrangement 22 is configured to illuminate subsequent edge portions 24-1 and 24-2 of the wafer edge and to receive the transmitted fractions 26-1 and the reflected fractions 26-2 of the illumination from the illuminated edge portions 24-1 and 24-2, and to output the first sensor signal 28-1 based on the transmitted fractions 26-1 of the illumination and the second sensor signal 28-2 based on the reflected fractions 26-2 of the illumination. The wafer edge is arranged between the first illumination source 32-1 and the first illumination sensor 34-1 so that the amount of the transmitted fractions 26-1 of the illumination is varying depending on a shape of the wafer edge. The illuminated edge portion 24-1 defines the first range of detection, wherein the illuminated edge portion 24-2 defines the second range of detection. The sensor arrangement 22 further comprises the first illumination source 32-1 configured to illuminate the wafer edge for creating the transmitted fractions 26-1 of the illumination and the second illumination source 32-2 configured to illuminate the wafer edge for creating the reflected fractions 26-2 of the illumination. The sensor arrangement 22 further comprises a first illumination sensor 34-1 configured to sense the transmitted fractions 26-1 of the illumination and to output the first sensor signal 28-1 and a second illumination sensor 34-2 configured to sense the reflected fractions 26-2 of the illumination and to output the second sensor signal 28-2.

The first illumination source 32-1, the second illumination source 32-2 and the second illumination sensor 34-2 are arranged at a side of the wafer, opposing a side of the wafer which is facing the wafer support 18, wherein the first illumination sensor 34-1 is arranged at the opposing side of the wafer arrangement 14.

The second illumination source 32-2 is also configured to emit illumination in the direction of the wafer 16, wherein the reflected fractions 26-2 of the illumination are reflected by the wafer 16 at least partially, so that the reflected fractions 26-2 vary dependent on a presence of the pre-aligning element within the illuminated wafer edge portion 24-2.

FIG. 4b shows a schematic top view of apparatus 40. The wafer arrangement 14 is rotatable with respect of an axis to rotation 35, so that the position of the pre-aligning element 12 is variable with respect to the sensor arrangement 22. The evaluation unit 42 is configured to evaluate the first sensor signal 28-1 and to determine the first position information with respect to the coarse position of the pre-aligning element 12 if the first sensor signal 28-1 indicates that the transmitted fractions 26-1 of the illumination have reached the predetermined threshold value. The first position information indicates that the pre-aligning element 12 is at least partially located within the currently evaluated edge portion 24-1. The evaluation unit 42 is further configured to determine a second position information based on the second sensor signal 28-2 and the first position information, after the evaluation unit 42 has determined the first position information.

In case, the first position information 28-1 indicated a presence of the pre-aligning element 12 within the illuminated edge portion 24-1, a further rotation of the wafer arrangement 14 leads to a movement of the pre-aligning element 12. Based on the first position information the evaluation unit 42 evaluates the second sensor signal 28-2.

The first position information, indicating the coarse position of the pre-aligning element 12 at the wafer 16, e.g. with respect to a Cartesian or an polar coordinate system, is considered when rotating the wafer 16 and moving the pre-aligning element 12 towards the edge portion 24-2.

Figure 5A:
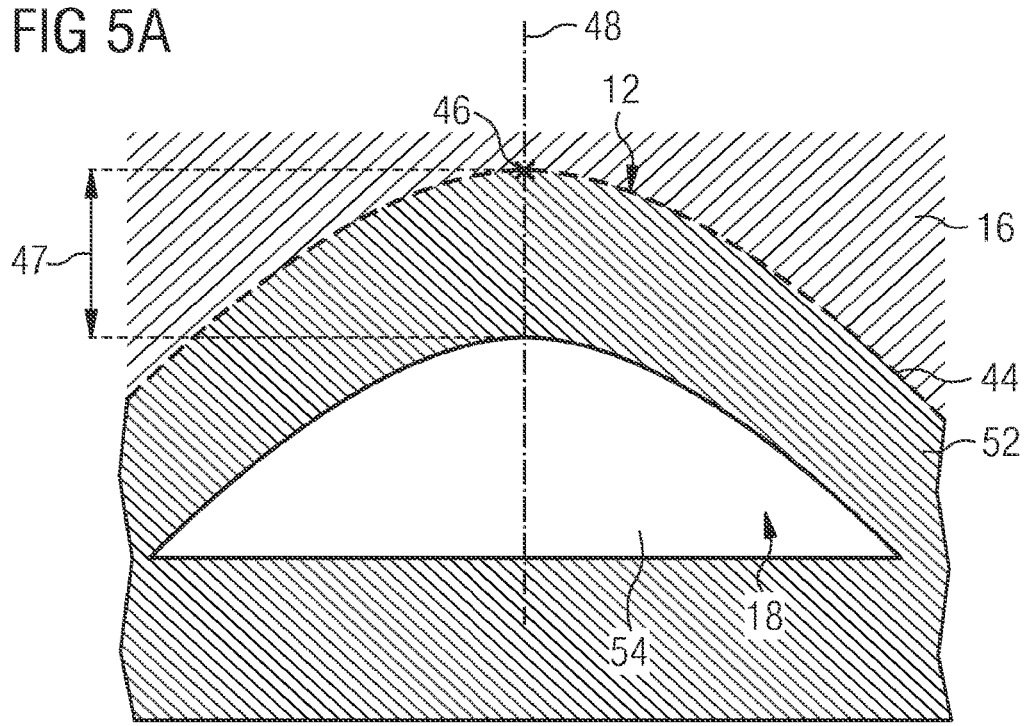
FIG. 5a shows a section of a top view on the pre-aligning element of the wafer according to an embodiment in an optimal case.

FIG. 5a shows a section of a top view on the pre-aligning element 12 of the wafer 16 carried by the wafer support 18 by being fixed to the wafer support 18 by an adhesive 52 in an optimal case. The pre-aligning element 12 forms an edge 44, a pathway of the edge 44 carrying the information of the position of the pre-aligning element 12. A center point 46 of the pathway of the edge 44 defines a center 48 of the pre-aligning element 12. Regarding the edge 44 as a graph of a function, the center point 46 is defined by a maximum of the graph of the function.

After arranging the adhesive 52 at the wafer 16 or the wafer support 18, the wafer 16 is arranged at the wafer support 18. Portions of the adhesive 52 are oozed out when fixing the wafer 16 to the wafer support 18 and form an edge 45 of the adhesive 52 which is not parallel to the edge 44. A distance 47 between the edges 44 and 45 along the center 48 of the pathway of the edge 44 is not pre-defined but a result of the fixing of the wafer 16 to the wafer support 18 and may vary between single wafers. The edge 45 being not parallel to the edge 44 reduces the degree of matching between a pattern of the signal which is detected by an illumination sensor sensing the transmitted fractions of the illumination and a pre-defined pattern of an expected pattern of the edge 44 and therefore the accuracy of the method.

The remaining area 54 of the wafer arrangement 18 which is not covered by either the wafer 16 or the adhesive 52 is configured to be transparent for the illumination generated by the illumination source configured to generate the transmitted fractions of the illumination. Thus, an illumination of the remaining area 54 of the wafer support 18 leads to a varying intensity of the transmitted fractions of the illumination along the remaining area 54. A maximum of the intensity is arranged along the center 48 of the pathway of the edge 44 of the pre-aligning element 12. Thus, an evaluation of the intensity of the transmitted fractions of the illumination leads to the first position information in addition to the evaluation of the pattern of the signal outputted by the illumination sensor.

Figure 5B:
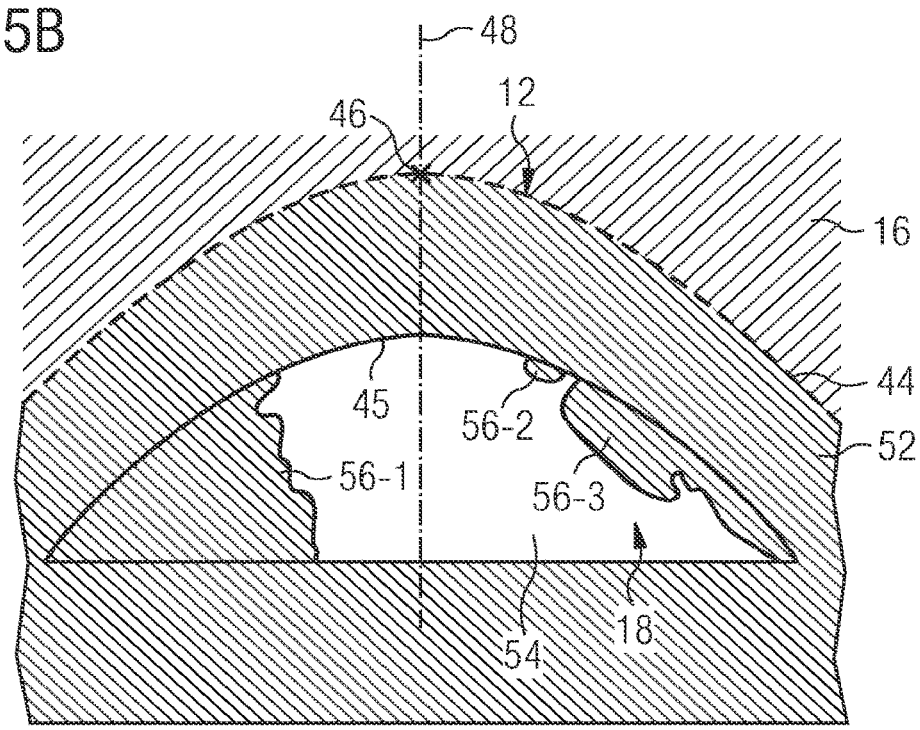
FIG. 5b shows a section of a top view on the pre-aligning element according to the embodiment shown in FIG. 5a in a realistic scenario.

FIG. 5b shows a section of a top view on the pre-aligning element 12 of a realistic scenario, wherein the attachment of the wafer 16 to the wafer support 18 leads the adhesive 52 to ooze out of the range of the wafer support 18 covered by the wafer 16 and further to form surpluses 56-1, 56-2 and 56-3. The surpluses 56-1, 56-2 and 56-3 cover additional areas of the wafer support 18, leading to a reduction of the remaining area 54 of the wafer support 18. The areas which are covered by the surpluses 56-1, 56-2 and 56-3 are distributed statistically. Thus, the intensity of the transmitted fractions of the illumination at a location or an area is changed, e.g. reduced statistically.

As a result the presence of the pre-aligning element 12 is can be determined by the evaluation unit 42, when evaluating the first sensor signal 28-1 based on the transmitted fractions 26-1 of the illumination with a low error rate.

To obtain a finer and/or more precise position information, the evaluated area of the pre-aligning element 12 is afterwards evaluated utilizing the second sensor signal 28-2 by the evaluation unit 42 which then may detect the edge 44 of the pre-aligning element 12 including the pathway of the edge 44 while avoiding false detections of grooves caused by steps during preprocessing.

FIG. 6 shows a flowchart of a method 100 for detecting a pre-aligning element at a wafer, the wafer having the pre-aligning element at a wafer edge. In a first step 101, subsequent edge portions of the wafer edge are illuminated with a sensor arrangement, transmitted fractions and reflected fractions of the illumination from the illuminated edge portion are received with an illumination sensor, and a first and a second sensor signal are outputted, wherein the first sensor signal is based on the transmitted fractions of the illumination and the second sensor signal is based on the reflected fractions of the illumination. In a second step 102, the first sensor signal is evaluated with an evaluation unit and a first position information is determined with respect to a coarse position of the pre-aligning element if the first sensor signal indicates that the transmitted fractions of the illumination have reached a predetermined threshold value, wherein the first position information indicates that the pre-aligning element is at least partially located within the currently evaluated edge portion. In a third step 103, after having determined the first position information, a second position information based on the second sensor signal and the first position information is determined, wherein the second position information indicates the fine position of the pre-aligning element.

FIG. 7 shows a flowchart of a method 200 for detecting a pre-aligning element at a wafer with an apparatus, the wafer having the pre-aligning element at a wafer edge. In a first step 201, subsequent edge portions of the wafer edge are illuminated with a sensor arrangement, transmitted fractions and reflected fractions of the illumination are received from the illuminated edge portions with an illumination sensor, and a first and a second sensor signal are outputted, wherein the first sensor signal is based on the transmitted fractions of the illumination and the second sensor signal is based on the reflected fractions of the illumination. The first sensor signal is evaluated with an evaluation unit and a first position information is determined with respect to a coarse position of the pre-aligning element if the first sensor signal indicates that the transmitted fractions of the illumination have reached a predetermined threshold value, wherein the first position information indicates that the pre-aligning element is at least partially located within the currently evaluated edge portion. After having determined the first position information, a second position information based on the second sensor signal and the first position information is determined, wherein the second position information indicates the fine position of the pre-aligning element. In a second step 202, an actuator is controlled based on the pre-alignment signal for moving the wafer into a pre-alignment position with the actuator. The pre-alignment signal accounts for an actual position of the actuator and the first position information as the first position information is evaluated for example to decide the direction or the speed the actuator is to be moved. A control unit is configured to control the actuator for pre-aligning the wafer based on the first and second position information.

The inventive concept may be realized in the form of hardware and software modifications at a pre-aligner unit of a wafer stepper.

The hardware and software modifications for performing a pre-alignment based on a detection of the pre-aligning element 12 with a stepper, steppers are adapted that a reliable coarse detection of the pre-aligning element proceeds with optics utilizing transmitted illumination and afterwards for performing an accurate positioning and measurement of the shape of the pre-aligning element the operating mode is switched to using optics utilizing a reflected illumination.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method for detecting a pre-aligning element at a wafer edge of a wafer, the method comprising:
    illuminating subsequent edge portions of the wafer edge moving around an axis of rotation in a rotational direction;
    receiving transmitted fractions of the illumination of the edge portions at a first illumination sensor;
    outputting a first sensor signal to an evaluation unit, wherein the first sensor signal is based on the transmitted fractions of the illumination;
    receiving reflected fractions of the illumination of the edge portions at a second illumination sensor,
    outputting a second sensor signal to the evaluation unit, wherein the second sensor signal is based on the reflected fractions of the illumination; and
    determining a coarse position of the pre-aligning element in the rotational direction when the first sensor signal indicates that the transmitted fractions of the illumination have reached a predetermined threshold value, wherein the pre-aligning element is at least partially located within a currently evaluated edge portion; and
    after determining the coarse position, determining a fine position of the pre-aligning element in the rotational direction based on the first sensor signal and the second sensor signal.

2. The method according to claim 1, wherein the subsequent edge portions are illuminated with an illumination source.

3. The method according to claim 1, wherein the subsequent edge portions are illuminated with a first illumination source for creating the transmitted fractions of the illumination and a second illumination source for creating the reflected fractions of the illumination.

4. The method according to claim 1, wherein the subsequent edge portions are illuminated with a first illumination source for creating the transmitted fractions of the illumination and a second illumination source for creating the reflected fractions of the illumination.

5. The method according to claim 1, wherein the pre-aligning element is a notch.

6. The method according to claim 1, wherein the pre-aligning element is a flat wafer edge.

7. The method according to claim 1, further comprising controlling an actuator for moving the wafer into a pre-alignment position.

8. A non-transitory storage medium having stored thereon a computer program having a program code for performing, when running on a computer, a method for detecting a pre-aligning element at a wafer edge of a wafer, the method comprising:
    illuminating subsequent edge portions of the wafer edge moving around an axis of rotation in a rotational direction;

receiving transmitted fractions of the illumination of the edge portions at a first illumination sensor;

outputting a first sensor signal to an evaluation unit, wherein the first sensor signal is based on the transmitted fractions of the illumination;

receiving reflected fractions of the illumination of the edge portions at a second illumination sensor, outputting a second sensor signal to the evaluation unit, wherein the second sensor signal is based on the reflected fractions of the illumination; and determining a coarse position of the pre-aligning element in the rotational direction when the first sensor signal indicates that the transmitted fractions of the illumination have reached a predetermined threshold value, wherein the pre-aligning element is at least partially located within a currently evaluated edge portion; and after determining the coarse position, determining a fine position of the pre-aligning element in the rotational direction based on the first sensor signal and the second sensor signal.

9. An apparatus for detecting a pre-aligning element at a wafer edge of a wafer, the apparatus comprising:

a sensor arrangement configured to:
  illuminate subsequent edge portions of the wafer edge moving around an axis of rotation in a rotational direction;
  receive transmitted fractions of the illumination from the illuminated edge portions;
  output a first sensor signal, wherein the first sensor signal is based on the transmitted fractions of the illumination of the illuminated edge portions;
  receive reflected fractions of the illumination from the illuminated edge portions,
  output a second sensor signal, wherein the second sensor signal is based on the reflected fractions of the illumination of the edge portions; and a processor configured to:
  determine a first position information indicating a coarse position of the pre-aligning element in the rotational direction based on the first sensor signal when the first sensor signal indicates that the transmitted fractions of the illumination have reached a predetermined threshold value, wherein the first position information indicates that the pre-aligning element is at least partially located within a currently evaluated edge portion, and,
  after the first position information is determined, determine a second position information in the rotational direction based on the second sensor signal and the first position information, wherein the second position information indicates a fine position of the pre-aligning element.

10. The apparatus according to claim 9, wherein the sensor arrangement comprises an illumination sensor configured to sense the transmitted fractions and the reflected fractions of the illumination, a first illumination source configured to illuminate the wafer edge for creating the transmitted fractions of the illumination and a second illumination source configured to illuminate the wafer edge for creating the reflected fractions of the illumination, wherein the second illumination source and the illumination sensor are arranged at the same side of the wafer, and wherein the first illumination source is arranged at an opposing side of the wafer.

11. The apparatus according to claim 9, wherein the sensor arrangement comprises a first illumination sensor configured to sense the transmitted fractions of the illumination, a second illumination sensor configured to sense the reflected fractions of the illumination, a first illumination source configured to illuminate the wafer edge for creating the transmitted fractions of the illumination and a second illumination source configured to illuminate the wafer edge for creating the reflected fractions of the illumination, wherein the first and the second illumination sensor are arranged at the same side of the wafer and wherein the first illumination source is arranged at one side of the wafer and the second illumination source is arranged at an opposing side of the wafer.

12. The apparatus according to claim 9, wherein the apparatus is configured to detect the pre-aligning element in form of a notch.

13. The apparatus according to claim 9, wherein the apparatus is configured to detect the pre-aligning element in form of a flat at the wafer edge.

14. The apparatus according to claim 9, wherein the first position information indicates the position of the pre-alignment element within a first range of detection, wherein the second position information indicates the position of the pre-alignment element within a second range of detection, and wherein the second range of detection is equal or smaller than the first range of detection.

15. A pre-alignment system comprising:
  the apparatus according to claim 9; and
  an actuator configured to move the wafer into a pre-alignment position, wherein the processor is configured to control the actuator for pre-aligning the wafer based on the first and second position information.

16. The pre-alignment system according to claim 15, wherein the sensor arrangement comprises a first illumination sensor configured to sense the transmitted fractions of the illumination, a second illumination sensor configured to sense the reflected fractions of the illumination, and an illumination source configured to illuminate the subsequent edge portions of the wafer edge, wherein the illumination source and the second illumination sensor are arranged on the same side of the wafer, and wherein the first illumination sensor is arranged at an opposing side of the wafer.

17. The pre-alignment system according to claim 15, wherein the sensor arrangement comprises an illumination sensor configured to sense the transmitted fractions and the reflected fractions of the illumination, a first illumination source configured to illuminate the wafer edge for creating the transmitted fractions of the illumination and a second illumination source configured to illuminate the wafer edge for creating the reflected fractions of the illumination, wherein the second illumination source and the illumination sensor are arranged at the same side of the wafer, and wherein the first illumination source is arranged at an opposing side of the wafer.

18. The pre-alignment system according to claim 15, wherein the sensor arrangement comprises a first illumination sensor configured to sense the transmitted fractions of the illumination, a second illumination sensor configured to sense the reflected fractions of the illumination, a first illumination source configured to illuminate the wafer edge for creating the transmitted fractions of the illumination and a second illumination source configured to illuminate the wafer edge for creating the reflected fractions of the illumination, wherein the first and the second illumination sensor are arranged at the same side of the wafer, and wherein the first illumination source is arranged at one side of the wafer and the second illumination source is arranged at an opposing side of the wafer.

19. The pre-alignment system according to claim 15, wherein the first position information indicates the position of the pre-alignment element within a first range of detection, wherein the second position information indicates the position of the pre-alignment element within a second range of detection, and wherein the second range of detection is equal or smaller than the first range of detection.

* * * * *